(12) United States Patent
Lester

(10) Patent No.: US 8,729,580 B2
(45) Date of Patent: May 20, 2014

(54) LIGHT EMITTER WITH METAL-OXIDE COATING

(75) Inventor: Steven D. Lester, Palo Alto, CA (US)

(73) Assignee: Toshiba Techno Center, Inc., Tokyo (JP)

( * ) Notice: Subject to any disclaimer, the term of this patent is extended or adjusted under 35 U.S.C. 154(b) by 793 days.

(21) Appl. No.: 11/296,006

(22) Filed: Dec. 6, 2005

(65) Prior Publication Data

US 2013/0228808 A1 Sep. 5, 2013

(51) Int. Cl.
*H01L 33/00* (2010.01)

(52) U.S. Cl.
USPC ............ 257/98; 257/99; 257/100; 257/103; 257/E33.06; 257/E33.064; 257/E33.065; 257/E33.066; 257/E33.072

(58) Field of Classification Search
USPC .......................................... 257/94, 98, 79, 99
See application file for complete search history.

(56) References Cited

U.S. PATENT DOCUMENTS

| | | | |
|---|---|---|---|
| 6,323,052 B1* | 11/2001 | Horie et al. ...................... 438/46 |
| 6,495,862 B1* | 12/2002 | Okazaki et al. ................. 257/103 |
| 6,657,236 B1* | 12/2003 | Thibeault et al. ............... 257/98 |
| 7,154,125 B2* | 12/2006 | Koide et al. ..................... 257/95 |
| 7,244,957 B2* | 7/2007 | Nakajo et al. ................... 257/13 |
| 2002/0195609 A1* | 12/2002 | Yoshitake et al. ............... 257/81 |
| 2003/0077847 A1* | 4/2003 | Yoo .................................. 438/22 |
| 2003/0116767 A1* | 6/2003 | Kneissl et al. ................... 257/79 |
| 2004/0159836 A1* | 8/2004 | Sugimoto et al. ............... 257/40 |
| 2005/0104080 A1* | 5/2005 | Ichihara et al. ................. 257/98 |
| 2005/0174046 A1* | 8/2005 | Hasegawa et al. ............. 313/504 |
| 2005/0179130 A1* | 8/2005 | Tanaka et al. ................. 257/730 |
| 2005/0189558 A1* | 9/2005 | Liu ................................. 257/100 |
| 2005/0201439 A1* | 9/2005 | Horie ........................... 372/43.01 |
| 2005/0277218 A1* | 12/2005 | Nakajo et al. ................... 438/46 |
| 2005/0285132 A1* | 12/2005 | Orita ................................ 257/99 |
| 2006/0091405 A1* | 5/2006 | Kwak .............................. 257/79 |
| 2006/0273335 A1* | 12/2006 | Asahara et al. ................. 257/98 |
| 2007/0018178 A1 | 1/2007 | Lai et al. |

OTHER PUBLICATIONS

Suzuki, et al. "Optical Constants of Cubic GaN, AlN, and AlGaN Alloys," Jun. 1, 2000, Jpn. J. Appl. Phys. vol. 39 (2000) pp. L497-L499, Part II, No. 6A.*
Sands, T., et al.; "Laser liftoff of Gallium Nitride from Sapphire Substrates"; http://www.ucop.edu/research/micro/98_99/98_133.pdf [Jun. 5, 2007].
Ambacher, O., et al.; "Laser-induced Liftoff and Laser Patterning of Large Free-standing GaN Substrates"; Mat.Res.Soc.Symp. vol. 617; 2000 Materials Research Society.
Wierer, J.J., et al.; "InGaN/GaN quantum-well heterostructure light-emitting diodes employing photonic crystal structures"; App.Phy. Let, vol. 84, Nbr.19, May 10, 2004.

* cited by examiner

*Primary Examiner* — Meiya Li
(74) *Attorney, Agent, or Firm* — Hogan Lovells US LLP

(57) ABSTRACT

A light emitting device based on a AlInGaN materials system wherein a coating is used to improve the extraction of light from a device. A coating has a very low optical loss and an index of refraction greater than 2. In a preferred embodiment the coating is made from $Ta_2O_5$, $Nb_2O_5$, $TiO_2$, or SiC and has a thickness between about 0.01 and 10 microns. A surface of a coating material may be textured or shaped to increase its surface area and improve light extraction. A surface of the coating material can also be shaped to engineer the directionality of light escaping the layer. A coating can be applied directly to a surface or multiple surfaces of a light emitting device or can be applied onto a contact material. A coating may also serve as a passivation or protection layer for a device.

18 Claims, 16 Drawing Sheets light-emitting-device with metal-oxide layer on ITO contact light-emitting-device with metal-oxide layer on ITO contact light-emitting-device with metal-oxide layer on ITO contact thin film light-emitting-device with metal-oxide coating Flip chip light-emitting-device with metal-oxide coating on top with substrate.

Flip chip light-emitting-device with metal-oxide coating on top; substrate removed

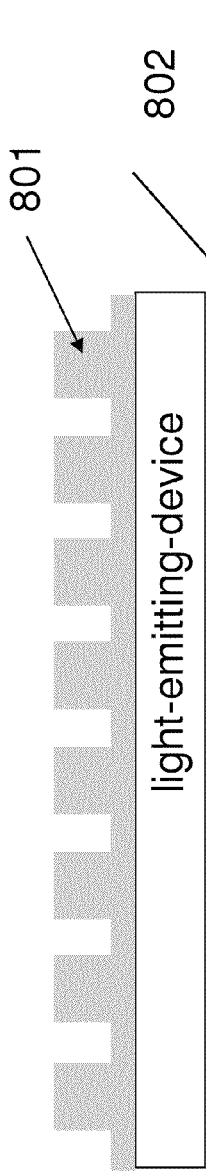
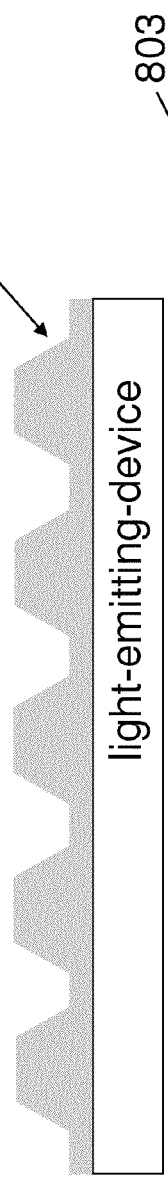
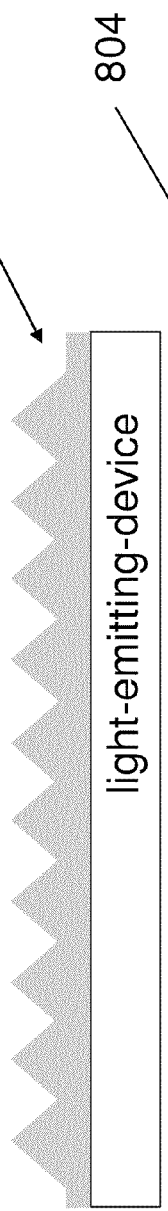
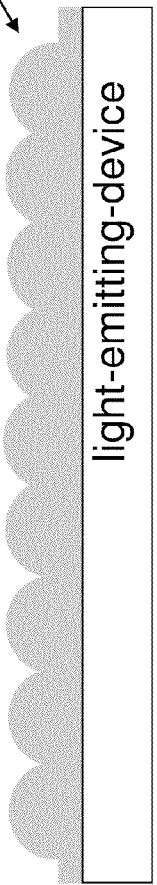
FIGURE 8A
FIGURE 8B
FIGURE 8C
FIGURE 8D Metal-oxide coating patterned into a photonic structure.

LIGHT EMITTER WITH METAL-OXIDE COATING

BACKGROUND OF THE INVENTION

Light emitting devices (LEDs) are an important class of solid state devices that convert electric energy to light and commonly comprise an active layer of semiconductor material sandwiched between additional layers. As the quality of semiconductor materials have improved, the efficiency of LEDs has also improved. Commercially-available LEDs are being made from alloys of indium, aluminum, and gallium with nitrogen (AlInGaN). These alloys make possible LEDs which operate in the ultra-violet to green spectral regions. However, the efficiency of LEDs is limited by their inability to couple all of the light that is generated by an active layer out of the LED chip. When an LED is energized, light emitting from its active layer (in all directions) reaches the LED surfaces at many different angles. Typical semiconductor materials have a high index of refraction compared to ambient air (n=1.0) or encapsulating epoxy (n≈1.5). According to Snell's law, light traveling from a material having an index of refraction, $n_1$, to a material with a lower index of refraction, $n_2$, at an angle less than a certain critical angle $\theta_C$ relative to the surface normal direction will cross to the lower index region, where $$\theta_C = \sin^{-1}(n_1/n_2) \tag{1}$$

Light that reaches the semiconductor surface at angles greater than $\theta_C$ will experience total internal reflection. This light is reflected back into the LED chip where it can be absorbed within the chip or in metal contact layers that are attached to the chip. For conventional LEDs, the vast majority of light generated within the structure suffers total internal reflection before escaping from the semiconductor chip. In the case of conventional GaN-based LEDs on sapphire substrates ~70% of the emitted light is trapped between the sapphire substrate and the outer surface of the GaN. This light is repeatedly reflected, greatly increasing its chance for reabsorption and loss.

Several techniques have been described to improve light extraction from LEDs. Providing the device with reflective contacts is one such technique. This improves LED efficiency because light that is trapped within the structure and is incident on the contact metals will be reflected back into the device rather than being absorbed. This allows the light to have another opportunity to escape the chip the next time it is incident on the LED surface. While reflective contacts improve light extraction, conventional LEDs still suffer from significant absorption losses. Roughening the top surface is another technique to improve light extraction. Roughening scatters, or sometimes randomizes, the angle of reflected light so that trapped light is redirected. This prevents light from being repeatedly reflected by parallel interfaces. Some of the scattered light then has an opportunity to strike a surface within the critical angle for internal reflection before being absorbed. Typical semiconductor layers are thin so only fine-scale roughening is usually possible. Also, roughened surfaces can cause other problems with the LED fabrication process. For example, contacts to roughened surfaces can be problematic. Also, roughened surfaces can cause it to be difficult to align photomasks to the wafer. And they make it difficult for the pattern recognition equipment that are used to bond and inspect the wafers to work properly. Therefore another technique to redirect trapped light is desirable. Another technique to scatter trapped light is to provide a rough interface between the GaN and the underlying substrate. This can be done by patterning and roughening the substrate prior to the growth of the semiconductor layers. This technique is effective at improving light extraction; however, the textured surface of the substrate affects the subsequent growth of the semiconductor layers. The quality of the semiconductor layers is often adversely affected, and the reproducibility of the growth is poor.

Additional methods of improving light output efficiency are reviewed in U.S. Pat. No. 6,657,236 which is included herein in its entirety by reference. U.S. Pat. No. 6,657,236 and U.S. Pat. No. 6,821,804 teach another method requiring a first spreading layer of a n type doped AlInGaN based material; a second spreading layer is preferably a thin, semi-transparent metal such as Pd, Pt, Pd/Au, Ni/Au, NiO/Au or some combination thereof deposited on, preferably, a p-type AlInGaN surface. Light extraction structures are then fashioned as arrays of light extraction elements or disperser layers. The light extraction elements are formed from a material having an index of refraction higher than the devices encapsulating material.

U.S. Pat. No. 6,831,302 teaches a structure comprising a multi-layer stack of materials, a layer of reflective material capable of reflecting at least about 50% of light impinging thereon and wherein a surface of a n-doped material, such as n-GaN, has a dielectric function that varies spatially according to some pattern. U.S. 2005/0227379 teaches shaping a surface of a semiconductor layer with a laser to improve the light extraction efficiency. Alternatively a substrate may contain three dimensional geometric light extraction patterns or a light emitting element on a substrate contains at least one layer with a pattern to produce light extraction features.

All of the prior art suffer from marginal improvement of light extraction efficiency or high manufacturing cost or both. A simple solution is needed which improves the overall light delivered from a light emitting device at a low cost.

BRIEF SUMMARY OF THE INVENTION

This invention relates generally to light emitting devices and more particularly to new combinations for enhancing their light output.

One object of the present invention is to provide a low cost device structure with improved light extraction efficiency. In contrast to the prior art no changes are made in the basic semiconductor portion of a light emitting device, so that virtually all of current light emitting diodes or other light emitting device structures can employ the benefits of this invention. The invention improves light extraction from LEDs by providing a medium, as a coating material, that light can enter easily and can propagate through with minimum attenuation. Surfaces of the medium may be configured to facilitate light exiting into air or an encapsulant. Additionally, the invention improves light extraction by greatly increasing the surface area of the device.

The present invention provides for a medium, as a dielectric coating or material within a given index of refraction and light extinction coefficient range, to be placed on the surface, or surfaces, of a solid state light-emitting device. When the refractive index of the dielectric coating is close to or higher than that of the light emitting surfaces then there are only minimal Fresnel reflections at the light emitting/dielectric interfaces. Also, the critical angle for light to enter the dielectric coating will be close to 90 degrees; thus, a very high percentage of the light that is incident from the semiconductor layers can enter the dielectric coating layers. If the dielectric coating is made to have very low loss then light can travel through the layer without appreciable attenuation. Further, if the dielectric coating is rough or appropriately patterned the surface area for light emission is increased. Since the dielectric coating can be thick compared to many semiconductor layers, larger-scale patterns can be formed in them compared to what is typically possible in semiconductors. This provides a greater opportunity for the photons to strike a surface where they may be extracted rather than being reflected back into lossy semiconductor or metal layers. One example of a material with an index of refraction greater than GaN is silicon carbide, which can be deposited by plasma-enhanced chemical vapor deposition, for example.

In one embodiment the dielectric medium is a coating layer added to the top layer of the structure of a light emitting device to improve the extraction of light from the device. The coating has low optical loss and an index of refraction about 2 or greater, preferably having an index of refraction close to or greater than the index of refraction of the uppermost semiconductor layer, for instance, GaN in an AlInGaN based materials system. The coating is made from one or combinations of a group of metal oxides comprising $Ta_2O_5$, $Nb_2O_5$, $TiO_2$; certain other materials are also acceptable such as silicon carbide and GaN based solid solutions. The coating has a thickness ranging from about 0.01 to about 10 microns. In alternative embodiments the surface of the coating material may be textured or shaped or patterned to increase the surface area, improve light extraction and to engineer the directionality of light escaping the layer. The coating may be applied directly to a primary surface or multiple surfaces of a light emitting device and may be applied over a contact electrode pattern. In alternative embodiments a coating layer is comprised of more than one coating layer, designed for specific optical functions such as improving or impeding the transmission of specific wavelength ranges or gradually diminishing the refractive index of a composite film as a films outer surface is approached. In these embodiments a coating may comprise additional materials such as $SiO_2$ in order to achieve specific optical properties of a multilayer coating. The coating layer may replace a passivation or protective layer on the device or function as one. The coating layer may be crystalline or not.

DETAILED DESCRIPTION OF THE INVENTION

Figure 1:
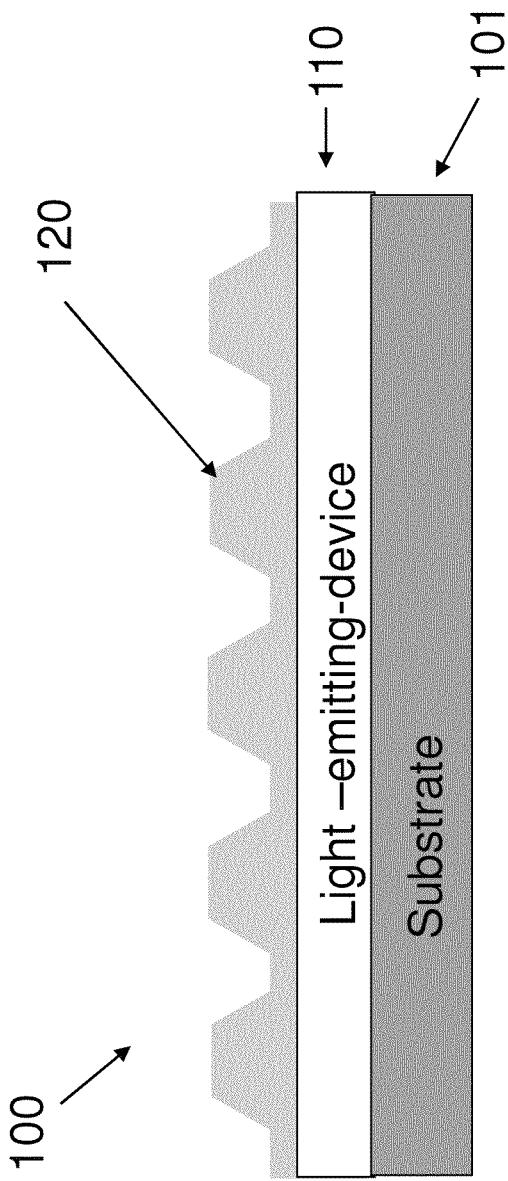
FIG. 1 is a schematic of one embodiment of the invention with a metal-oxide coating layer on top of a light emitting device.

FIG. 1 shows a schematic view of one embodiment of the invented light emitting structure 100 comprising a substrate portion 101, a light emitting device portion 110 and a metal-oxide coating portion 120. As used herein a substrate or submount portion provides at least a mechanical support for a light emitting device portion and metal-oxide coating portion. A substrate is chosen from a group comprising $Al_2O_3$, Si, SiC, AlInGaN based materials, metals, ceramics and glasses; these materials may be single crystal or not. A submount is chosen based on manufacturing convenience; typically a submount is chosen from a group comprising $Al_2O_3$, Si, SiC, metals, ceramics, plastics and glasses. As used herein a light emitting device portion is chosen from a group comprising light emitting diodes, light emitting heterojunctions, light emitting quantum well structures and other solid state devices capable of emitting light. As used herein a metal-oxide coating portion is chosen from a group comprising metal oxides, silicon carbide, gallium nitride based materials and other materials of appropriate optical and manufacturing characteristics such as $SiO_2$. As used herein, preferably, a metal-oxide coating portion has an index of refraction of about 2.0 or greater and transmits a high percentage of radiation passing through it; the thickness of a coating may be from about 10 nm to more than 10 microns depending on device requirements. Preferably, the coating's light extinction coefficient (the complex portion of the index of refraction) is about 0.2 or less, preferably 0.1 or less. Preferably a metal-oxide coating portion is chosen from a group comprising niobium pentoxide ($Nb_2O_5$), titanium dioxide ($TiO_2$), tantalum pentoxide ($Ta_2O_5$), silicon carbide (SiC) and gallium nitride (GaN). A metal-oxide coating also has a dielectric property; the term dielectric layer is used interchangeably herein.

Propagation of light within a specific material is characterized by the material's complex index of refraction, defined as:

$$n^* = n - i\kappa \qquad (2)$$

Here, n is the refractive index indicating the phase velocity relative to the speed of light in vacuum, while κ is called the light extinction coefficient or optical loss factor, which indicates the amount of absorption loss when the electromagnetic wave propagates through the material. Both n and κ are dependent on the wavelength of the radiation; values for different materials are readily available. In a preferred embodiment of the present invention, the n value of the metal-oxide coating is close to or greater than the n of GaN, ~2.45. The proximity of the refractive indices insures very little reflection of light occurs as light passes from a GaN layer and to a metal oxide layer. The κ value, a measure of absorption, should be as small as possible, preferably below 0.2 and more preferably below 0.1, so that light can travel within the coating with minimal attenuation.

When a dielectric layer has an index of refraction, n, that is somewhat less than that of a semiconductor then the critical angle for internal reflection of light incident from a semiconductor will be very large. The result is that a vast majority of light incident on a dielectric layer from a GaN based LED will be transmitted into the dielectric layer. Niobium pentoxide ($Nb_2O_5$), titanium dioxide ($TiO_2$), and tantalum pentoxide ($Ta_2O_5$) are examples of such dielectric layer materials. These dielectrics have indices of refraction of approximately 2.39, 2.46, and 2.08, respectively, compared to GaN which has an index of refraction of approximately 2.4. Dielectric coatings can be formed readily using sputtering, reactive sputtering, ion-beam assisted sputtering, e-beam evaporation, or ion-assisted, e-beam evaporation. Other deposition techniques such as chemical vapor deposition, CVD, plasma enhanced CVD, PECVD, metal-organic CVD, MOCVD, atomic layer deposition, ALD and others known to one knowledgeable in the art are considered equivalent embodiments.

Another advantage of a preferred dielectric coating is that it can be deposited in relatively thick layers and have extremely low optical losses. The thickness of a film can be on the order of the thickness of the semiconductor layers, approximately 3 to 4 microns. The limit on thickness is only limited by deposition time and by built up stresses in the films. Since a dielectric layer can be made thick it can be patterned to have textures or shapes with dimensions of several microns. This is an advantage compared to texturing semiconductor layers since larger structures cannot be formed; additionally semiconductor layers are expensive to form. Also, texturing or shaping a coating layer provides more surface area for light emission, increasing the light extraction efficiency. A coated dielectric layer can also be easily patterned into lenses or other specific shapes intended to maximize light extraction or reflect light in particular directions.

Coated dielectric layers can be combined with textured semiconductor surfaces. Also when there is a good index match between a semiconductor active or cap layers and a dielectric then a semiconductor surface can be smooth and not textured and an outer surface of a dielectric coating can be textured or otherwise patterned. This is an advantage because it allows for processing of smooth wafers which are less costly to manufacture.

Figure 2:
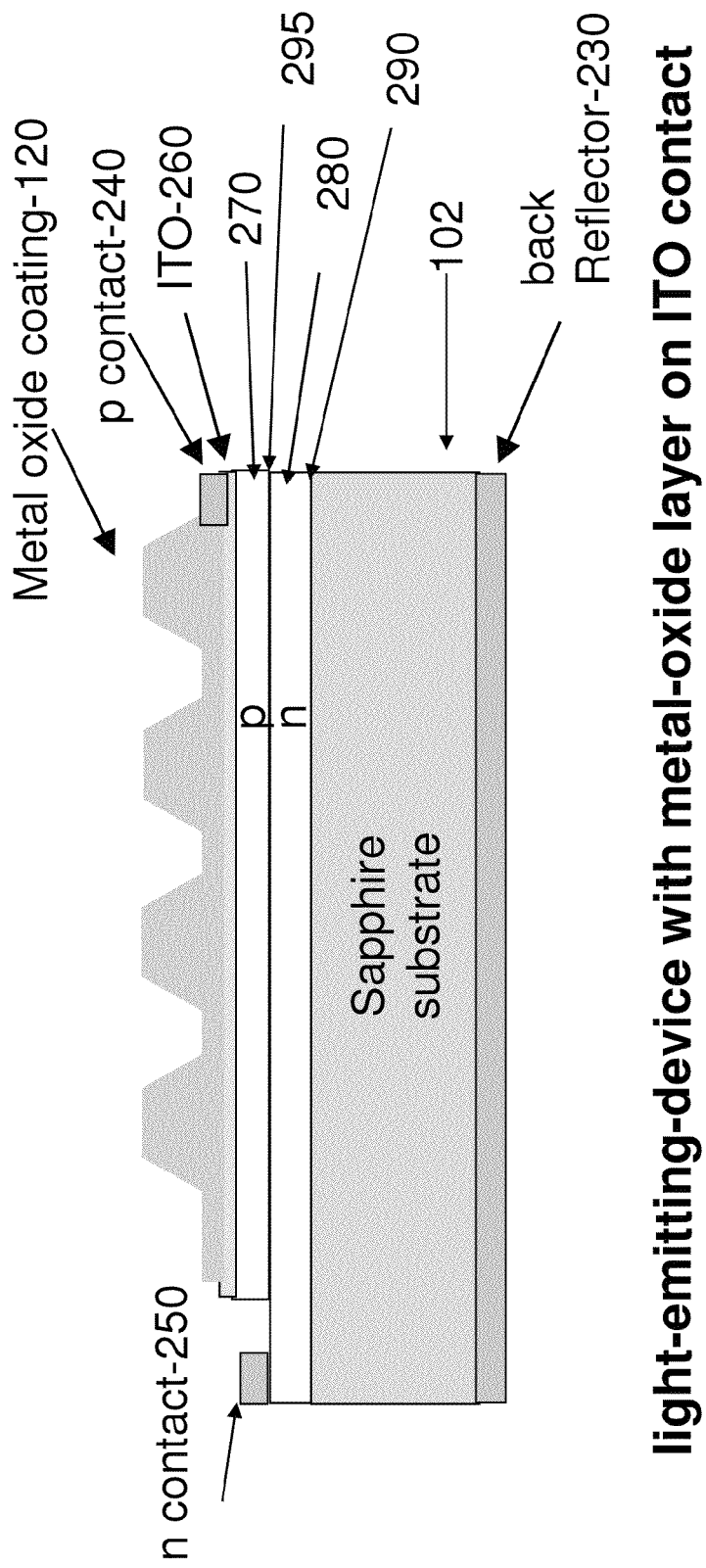
FIG. 2 is a schematic of another embodiment of the invention with a back reflector.

FIG. 2 is a schematic of another embodiment of the invention; light emitting structure 200 comprises a back reflector 230 on a transmissive substrate 102, such as sapphire or silicon carbide, with one or more first, optionally n-type, layers 280, at least one of which functions as a first cap layer, one or more second, optionally p-type, layers 270, at least one of which functions as a second cap layer, and, optionally, additional intervening layers, indicated as 295, a transmissive contact layer 260, such as ITO, n-layer contact 250, p-layer contact 240 and metal-oxide coating 120. In one embodiment, one or more n-type layers 280, one or more p-type layers 270 and, optionally, additional intervening layers (not shown), comprise an active region of an LED structure. Alternative structures of LED active regions may be a simple p-n junction diode or double heterojunction structure or multiple quantum well structure or others familiar to one knowledgeable in the art. An embodiment of a light emitting portion in a AlInGaN material system based light emitting device comprises a buffer layer 290, one or more first cap layers, within 280, at least one of which is a first conductivity type, an active region 295 comprising one or more layers, one or more second cap layers, within 270, at least one of which is a second conductivity type, one or more contact layers and one or more electrode layers. For instance, one embodiment of a light emitting portion comprises an InGaN nucleation and/or buffer layers, followed by GaN and/or n-type GaN first cap layers, followed by an active region comprising multiple quantum well active layers of InGaN type and barrier layers of n-type GaN, followed by p-type AlGaN type second cap layers, followed by n-type GaN and/or InGaN third cap layers, followed by one or more electrode layers. An electrode layer may be of aluminum, Ti/Al, Cr/Al, Ni/Au, Ni/Pd, Ni/Pt, or other combinations well known in the art. The preceding descriptions of various light emitting portions apply equally to light emitting portions 350, 450, 550, 650 and 750. In a FIG. 2 embodiment a back reflector 230 may be of aluminum or silver or multiple reflective layers to reflect light back into a LED structure and recapture its utility. Transmissive contact layer 260 may be of indium tin oxide; alternatively, a transmissive contact layer may be of nickel/gold (Ni/Au) composition or other alloys having high light transmission.

Figure 3:
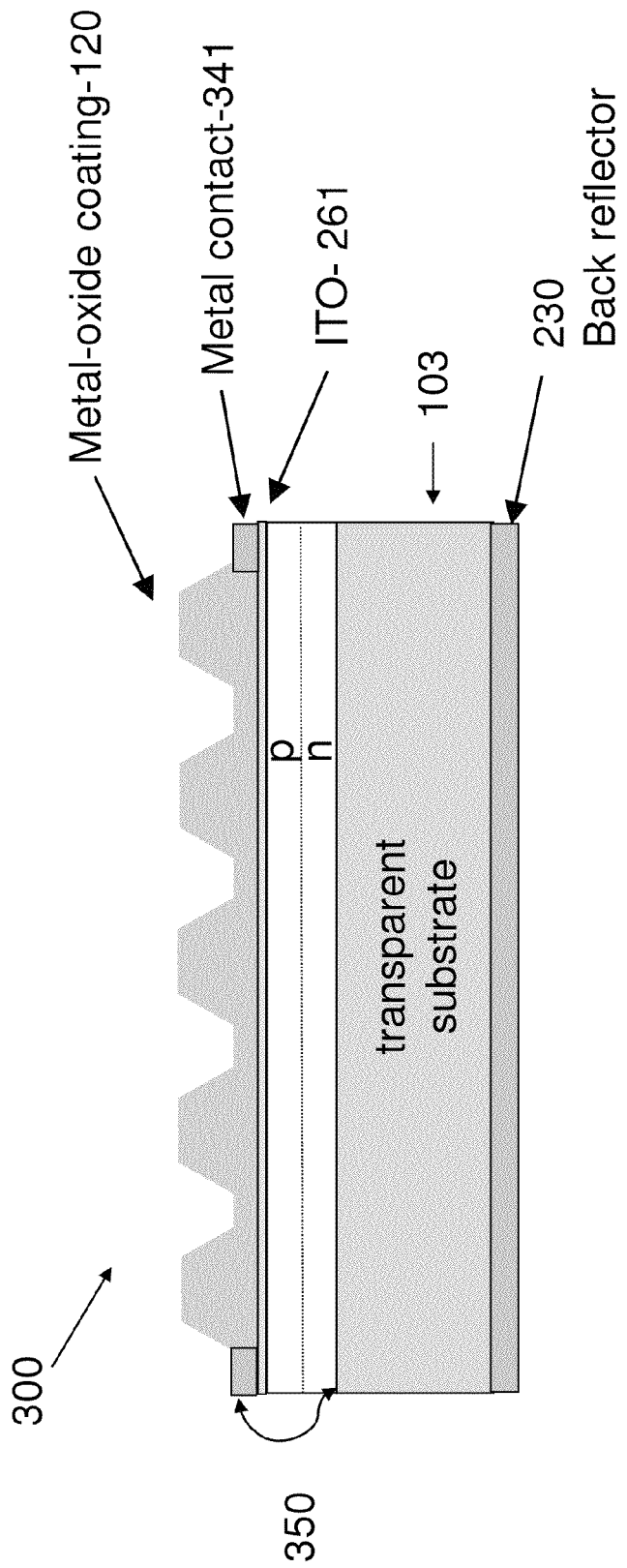
FIG. 3 is a schematic of another embodiment of the invention with a coating on a transparent metallic layer.

FIG. 3 is a schematic of another embodiment 300 of the invention with a metal-oxide coating 120 on a transparent metallic layer 261, underlying metal contact 341, which is already textured or roughened. Transparent substrate 103 may be sapphire or silicon carbide. A roughened transparent metallic layer provides for additional angles of incidence for entering and departing light; in combination with metal-oxide coating 120 of a predetermined index of refraction light extraction efficiency is increased.

Figure 4:
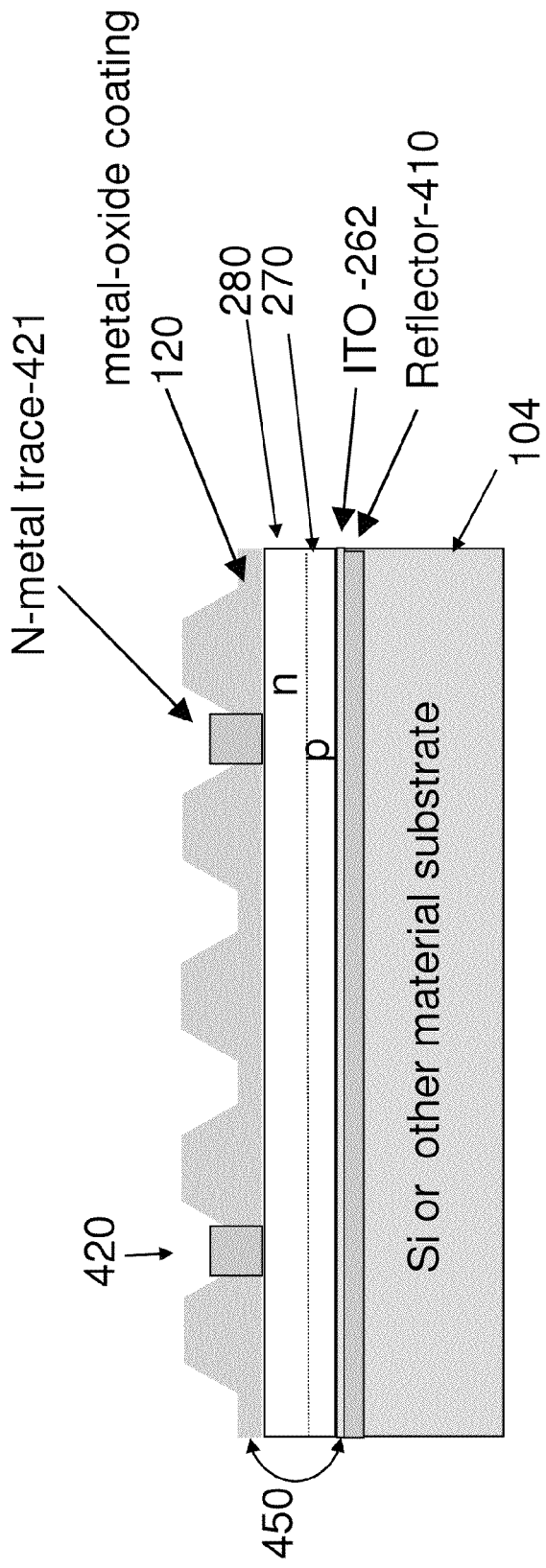
FIG. 4 is a schematic of another embodiment of the invention with a reflector layer over a substrate.

FIG. 4 is a schematic of another embodiment 400 of the invention with a reflector layer 410 over a substrate serving as a mechanical support. In this embodiment a light emitting device portion 450, comprising, at least, one or more n-type layers 280, one or more p-type layers 270 and, optionally, additional intervening layers (not shown), is manufactured on another substrate, removed and attached to substrate 104. Substrate 104 may comprise one or more layers such as reflector 410 and conductivity layer 262; optionally, reflector layer 410, conductivity layer 262, metal trace 420 and n-metal trace 421 and metal-oxide coating 120 may be formed on light emitting device portion 450 prior to separation from an original substrate.

One technique for separating a light emitting device portion from its original substrate is termed "laser liftoff". This technique is described in U.S. Pat. No. 6,071,795 and "Laser Liftoff of Gallium Nitride from Sapphire Substrates", Sands, T., et al.; Nov. 18, 2005: http://www.ucop.edu/research/micro/98_99/98_133.pdf. An alternative description is provided by Ambacher, O., et al., "Laser Liftoff and Laser Patterning of Large Free-standing GaN Substrates"; Mat. Res. Soc. Symp., Vol. 617, © 2000 Materials Research Society. All three publications are included in their entirety herein by reference.

Figure 5:
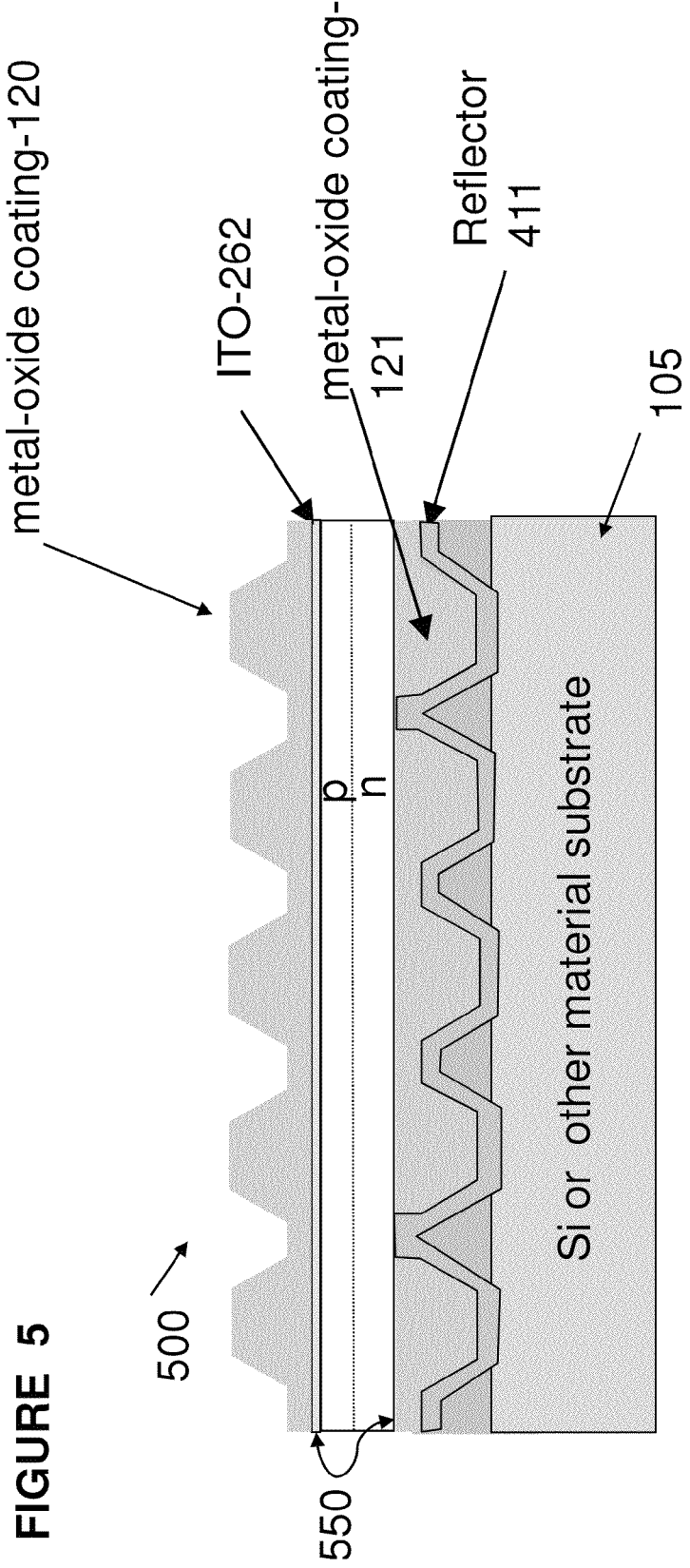
FIG. 5 is a schematic of another embodiment of the invention with a reflector structure over a substrate.

FIG. 5 is a schematic of another embodiment 500 of the invention similar to FIG. 4. A reflector structure 411 is formed over a patterned metal-oxide coating 121 on substrate 105. As in the previous embodiment a laser liftoff technique is used to transfer light emitting region 550 to substrate structure 105. Substrate 105 may comprise one or more layers such as reflector 411 and metal-oxide layer 121; optionally, conductivity layer 262 and metal-oxide coating 120 may be formed on light emitting device portion 550 prior to separation from an original substrate or after combination with substrate 105 comprising reflector 411 and coating 121. Reflector structure 411 with a patterned metal-oxide coating 121 on substrate 105 may take on various configurations and shapes; only one example is shown. One knowledgeable in the art of silicon on insulator wafer processing is familiar with alternative methods for transferring an active layer(s) to another substrate.

Figure 6:
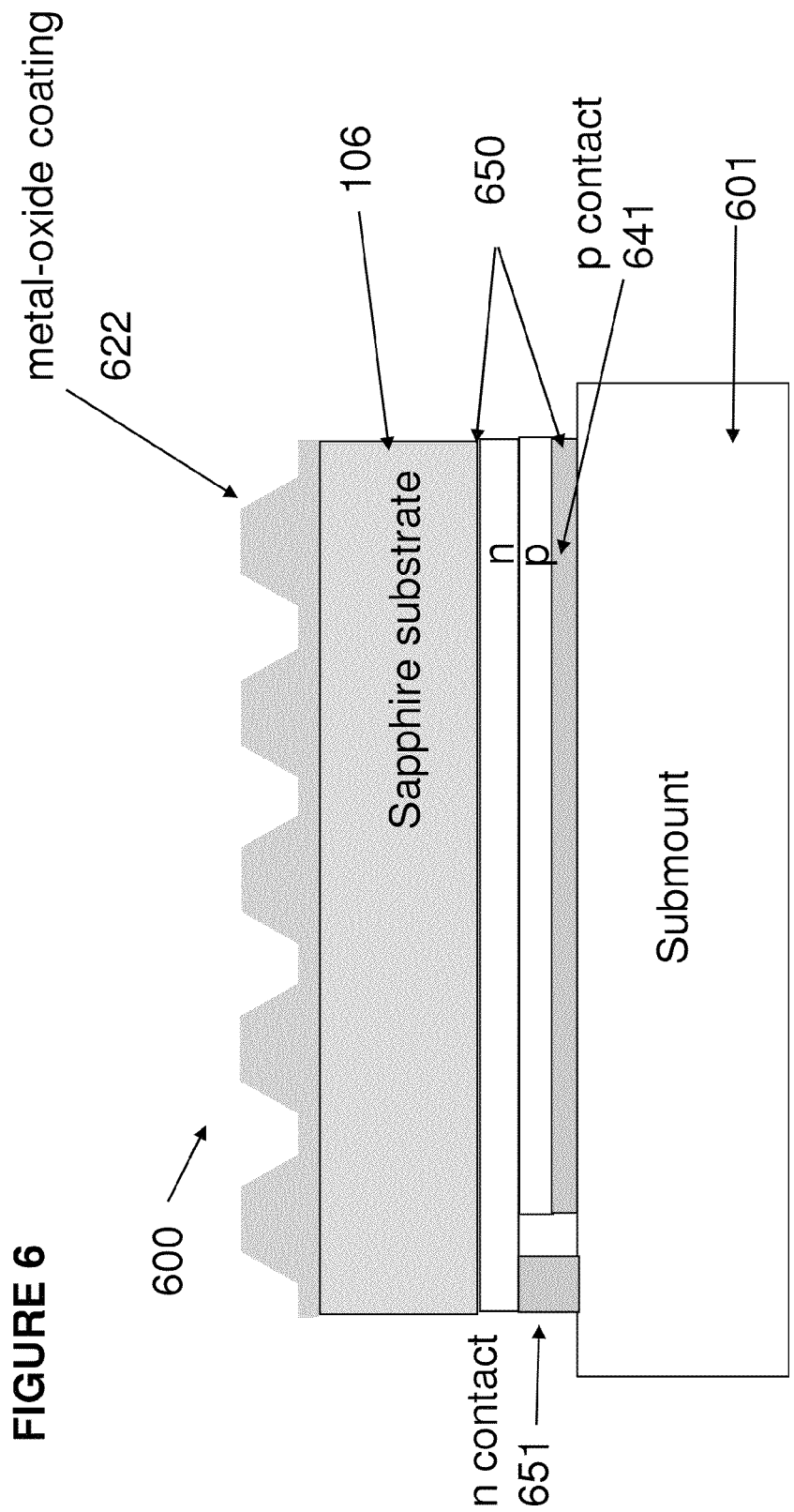
FIG. 6 is a schematic of another embodiment of the invention with a flip chip design.

FIG. 6 is a schematic of another embodiment of the invention with a flip chip design. Light emitting device 600 comprises metal-oxide coating portion 622, transmissive substrate 106, for instance sapphire, light emitting portion 650, n contact 651, p contact 641 and submount 601. N contact 651, p contact 641 and submount 601 are in mechanical contact and electrical communication. Submount 601 contains electrical circuits, not shown, to provide electrical connection to external circuits or packages. Optionally, submount 601 may comprise additional layers such as reflector 411 and metal-oxide coating 121, as shown in FIG. 5, to enhance reflection of light back through layers beginning with 641 and out through 106 while maintaining mechanical contact and electrical communication to contacts 651 and 641.

Figure 7:
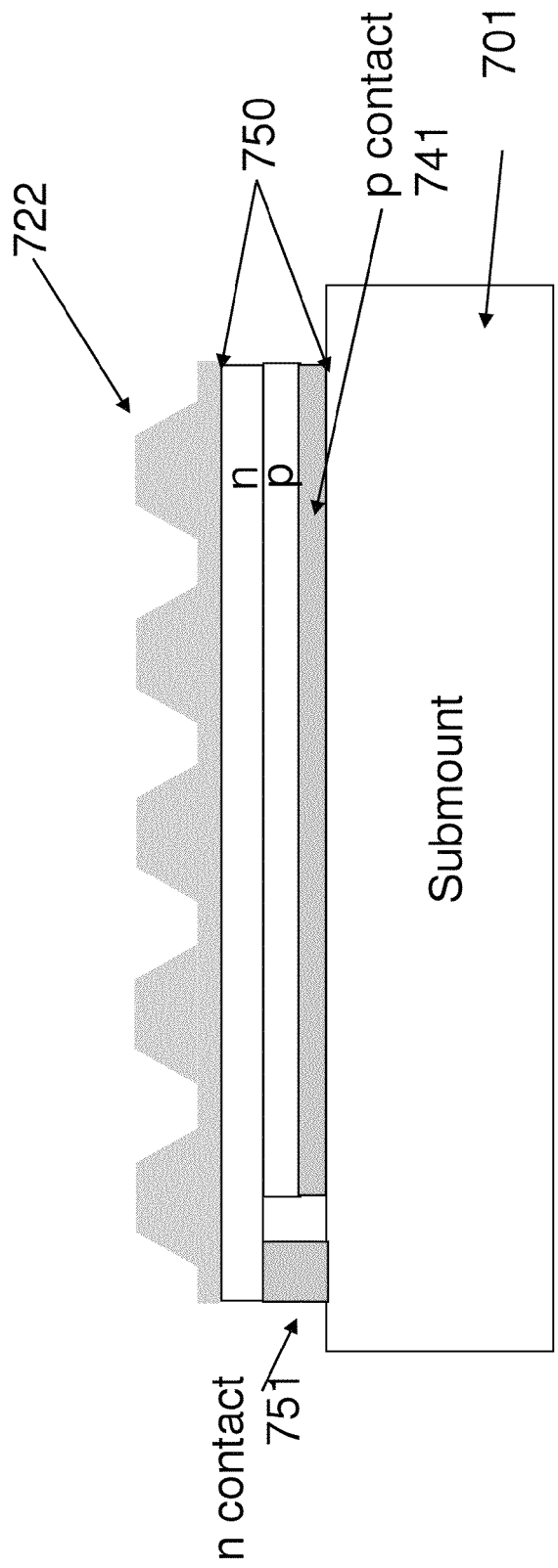
FIG. 7 is a schematic of another embodiment of the invention with a flip chip design with a submount substrate.

FIG. 7 is a schematic of another embodiment of the invention with a flip chip design with a submount substrate 701 and the original substrate removed. Light emitting device 700 comprises metal-oxide coating portion 722, active region 750, n contact 751, p contact 741 and submount 701. N contact 751, p contact 741 and submount 701 are in mechanical contact and electrical communication. Submount 701 contains electrical circuits, not shown, to provide electrical connection to external circuits or packages. Optionally, submount 701 may comprise additional layers such as reflector 411 and metal-oxide coating 121 to enhance reflection of light back through active region 750 while maintaining mechanical contact and electrical communication to n and p contacts 751 and 741.

Figures 8E, 8F:
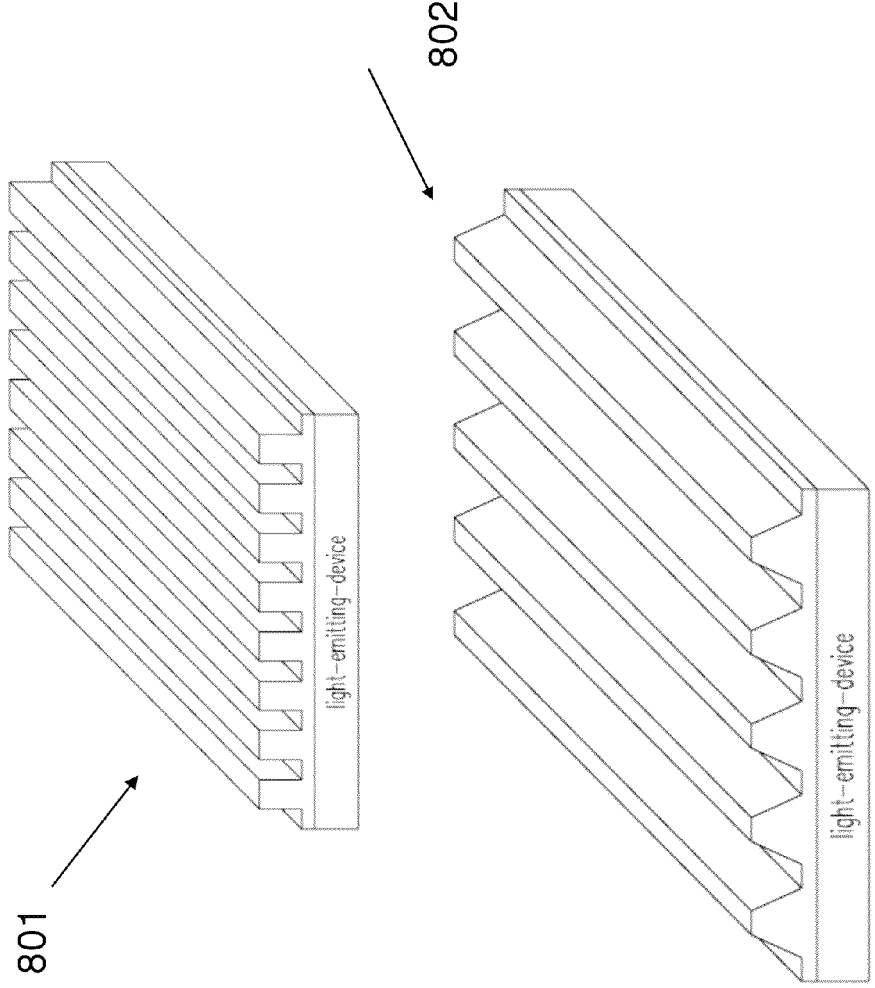
FIGS. 8a-8q are schematics of alternative patterns for a metal-oxide coating.
Figure 8G:
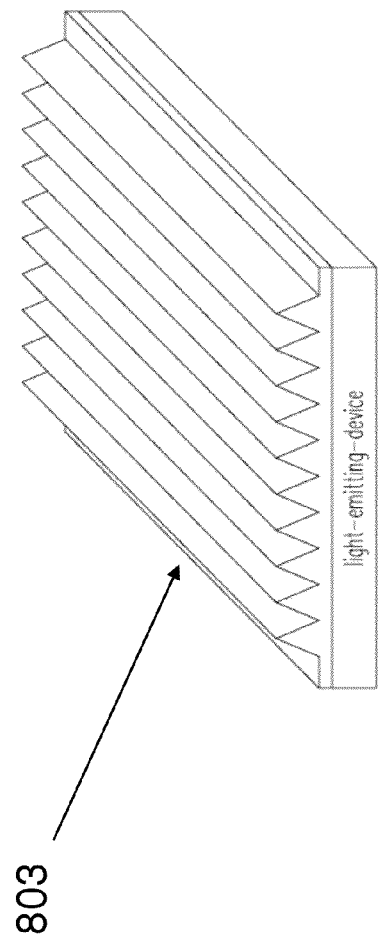
Figure 8H:
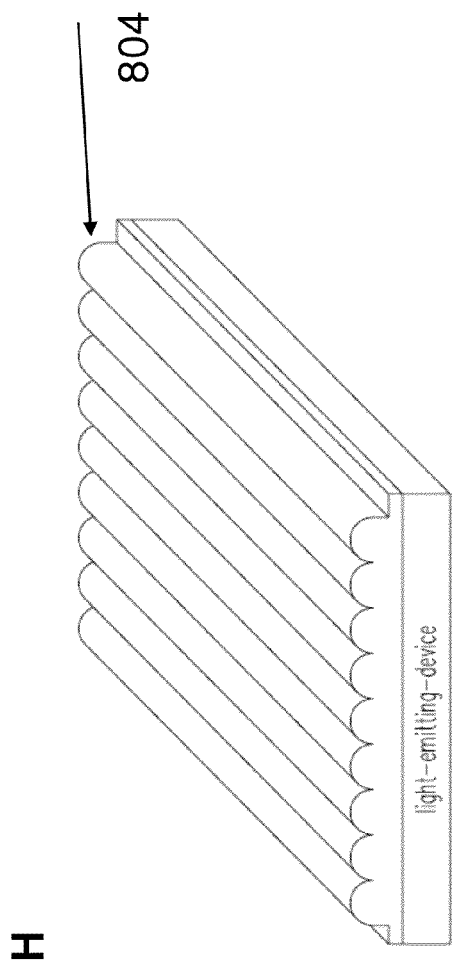
Figures 8I, 8J:
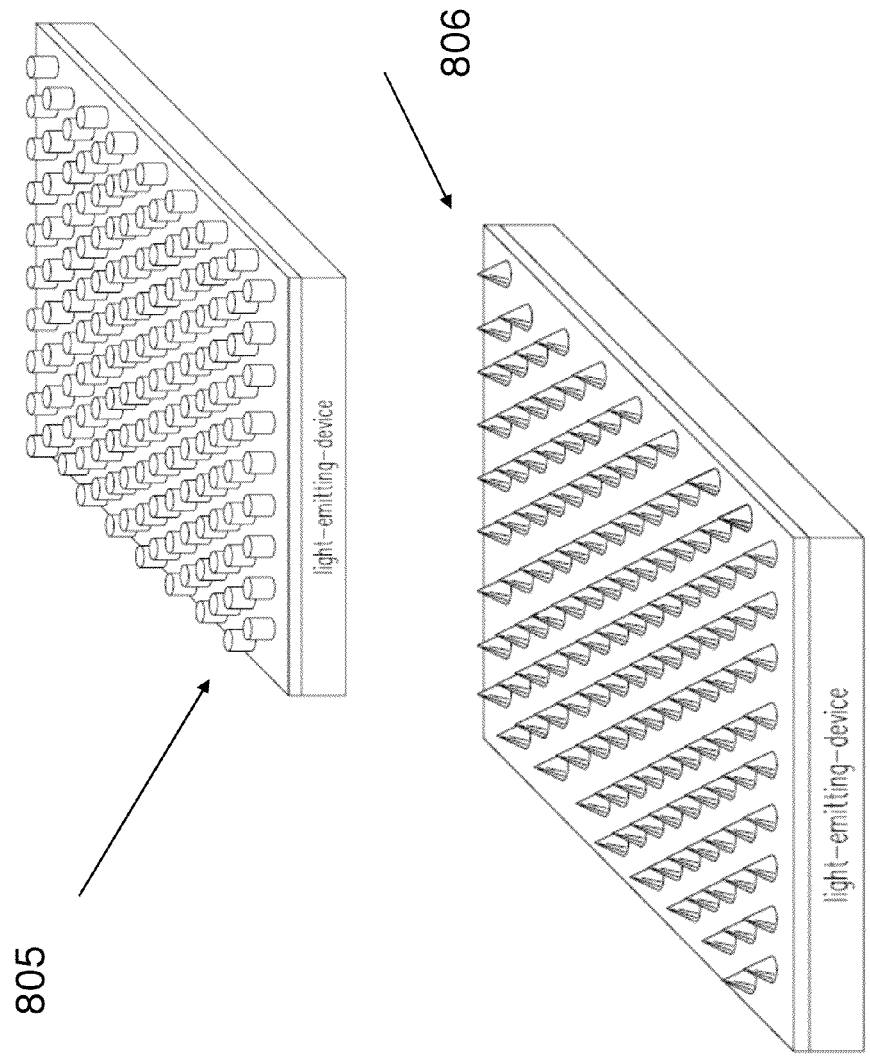
Figure 8K:
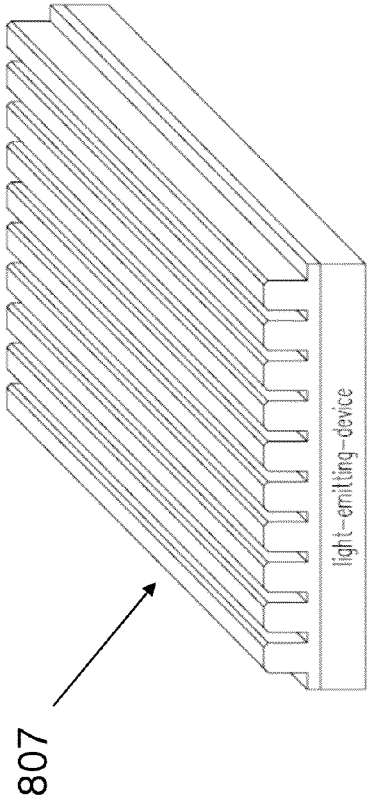
Figure 8L:
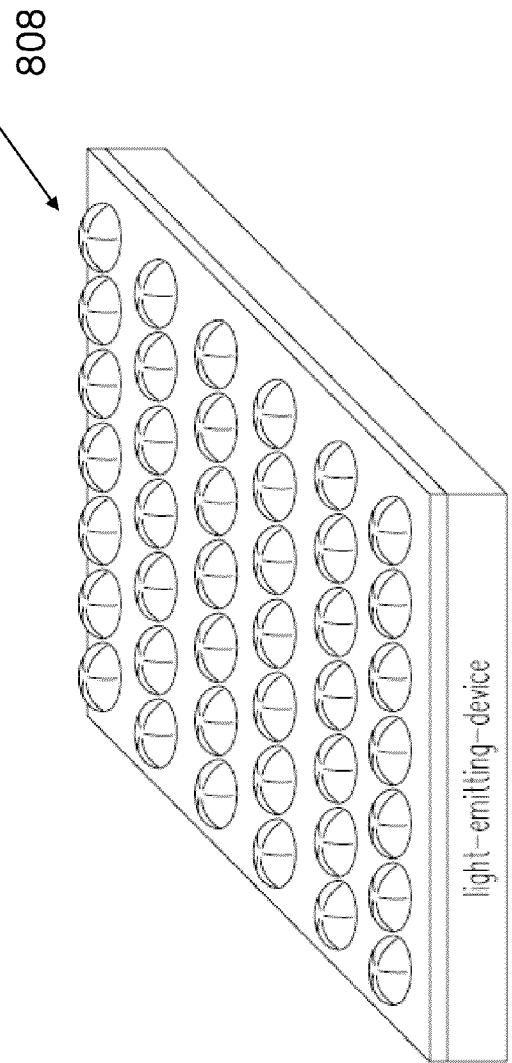
Figures 8M, 8N:
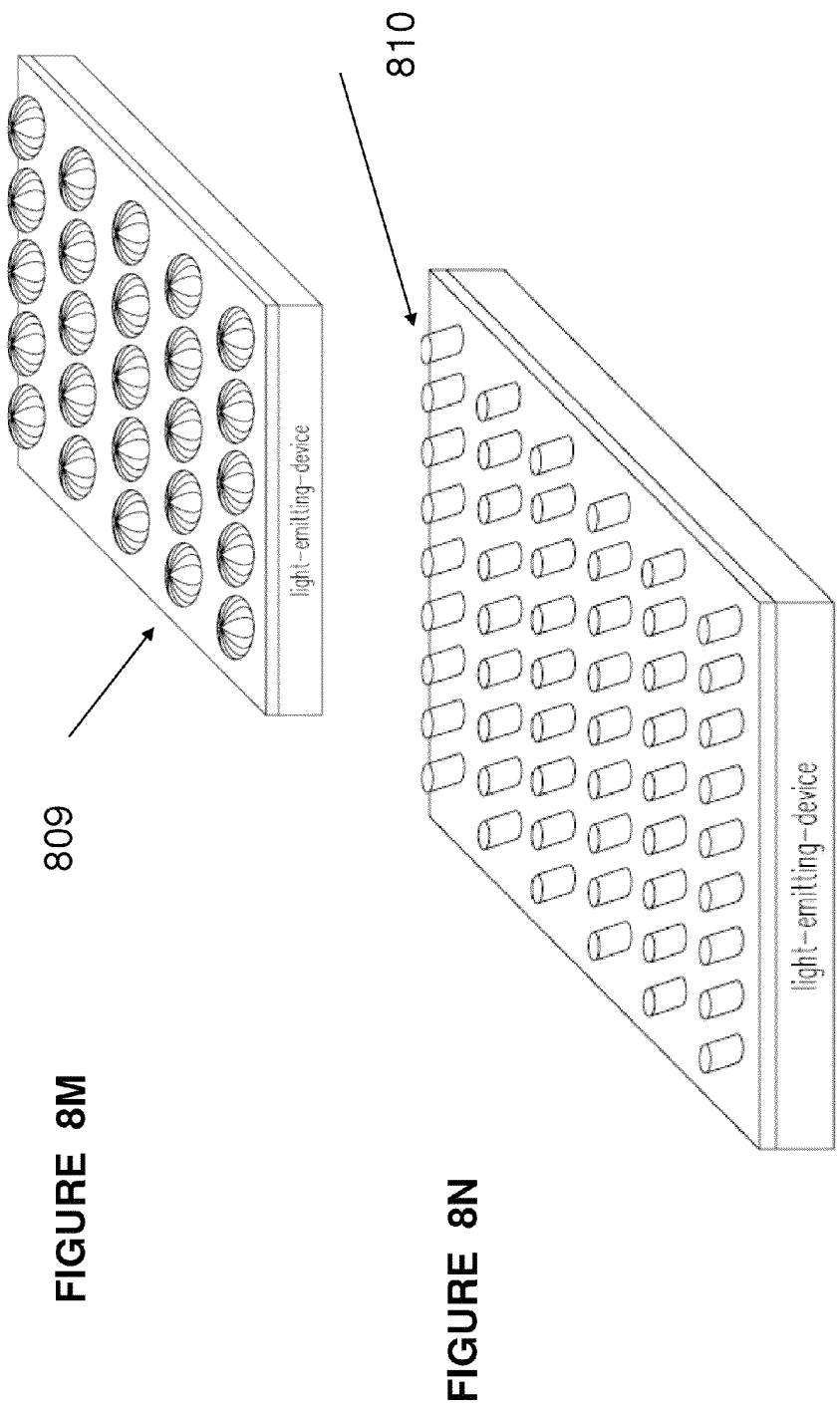
Figure 8O:
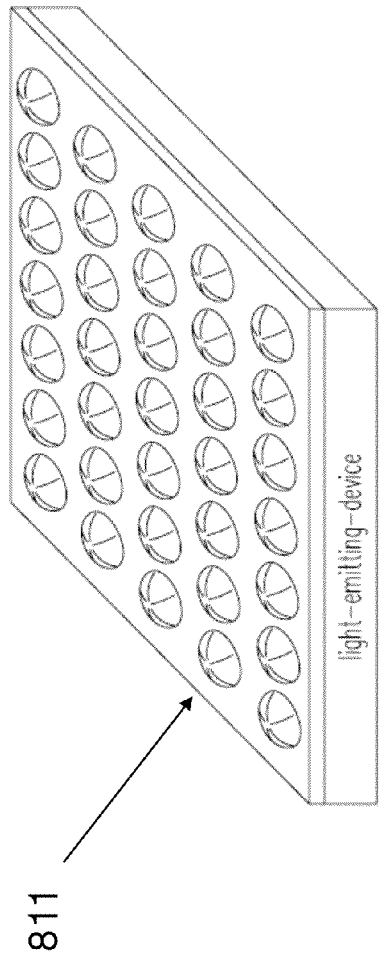
Figure 8P:
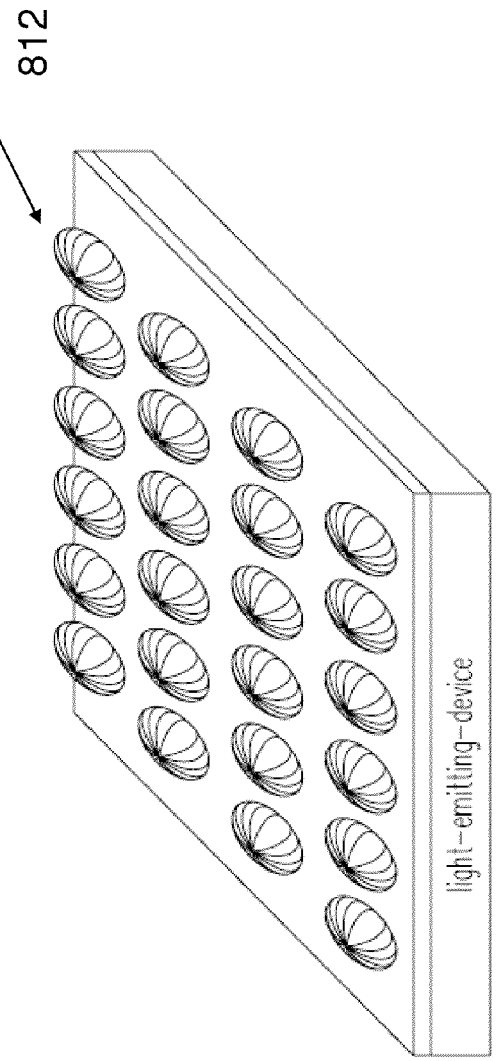
Figure 8Q:
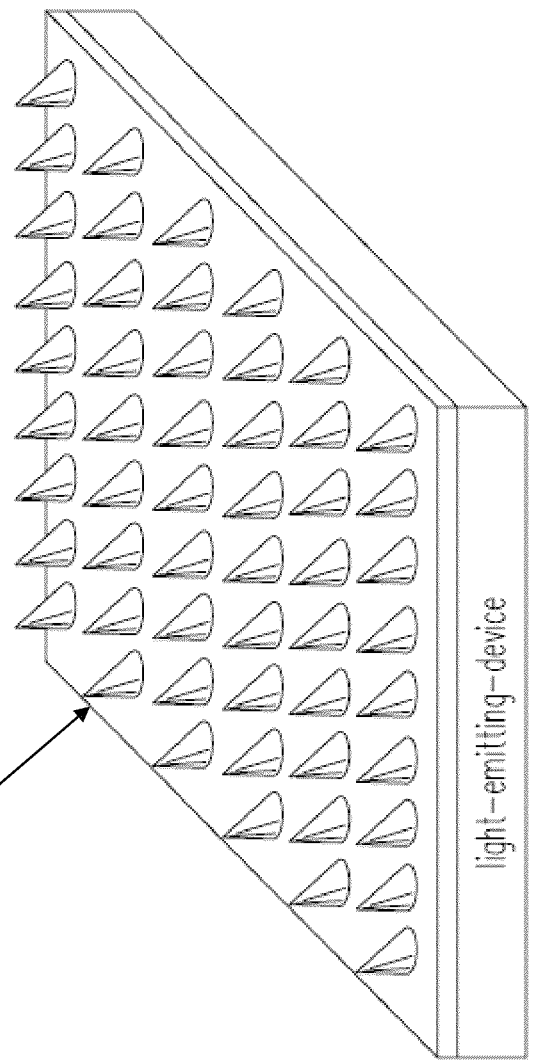
Figure 9:
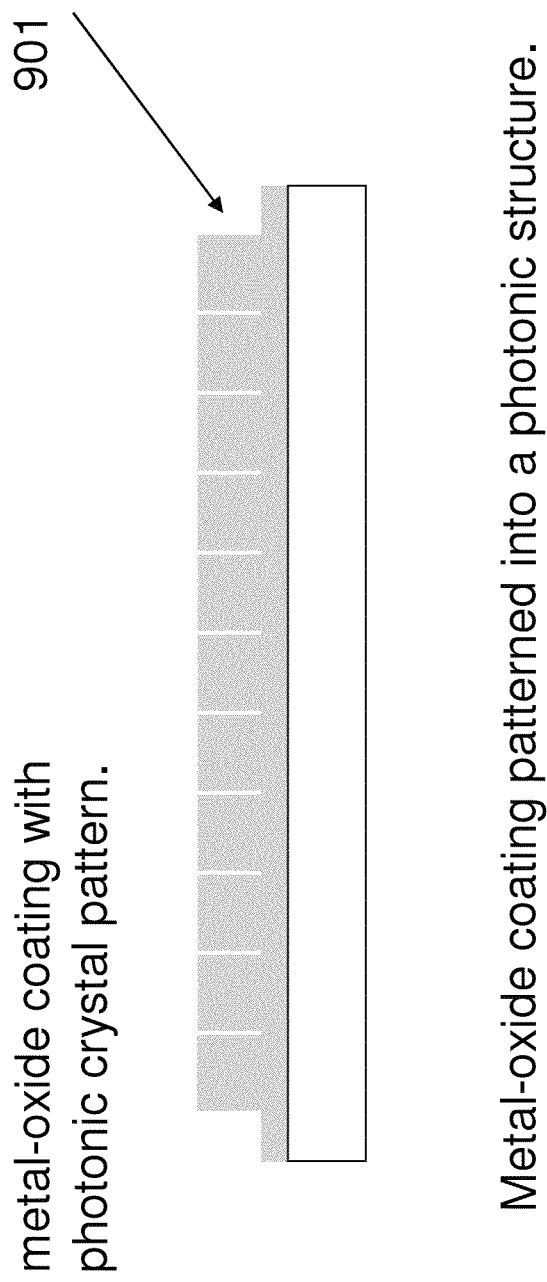
FIG. 9 is a schematic of another embodiment of a metal-oxide coating with a photonic crystal pattern.

FIGS. 8a-8q are schematics of alternative patterns and shapes for a metal-oxide coating. Patterns and shapes for metal-oxide coating layer 801-813 are chosen from a group comprising 801, ribs or rectilinear trenches or solids, 805 cylinders, 807 polygon shaped ribs, 803 triangular shaped ridges, hemispherical shaped mounds, 804 horizontal cylindrical shaped ribs, 809 ellipsoids, 808 hemispheres, 806 cones, 810 angled cylinders, 811 angled hemispheres, 812 angled ellipsoids, 802 angled rectilinear trenches or solids and 813 angled cones. FIG. 9 is a schematic of an alternative embodiment of a metal-oxide coating with a pattern or shape that also functions as a photonic crystal lattice 901. Not shown in FIGS. 8 and 9 are substrates or submounts. Patterns and shapes for elements for metal-oxide coating layer 801-813 and 901 have a geometrical shape chosen from a group comprising cylinders, ellipsoids, hemispheres, rectilinear trenches or solids, cones, angled cylinders, angled hemispheres, angled ellipsoids, angled rectilinear trenches or solids and angled cones and wherein element to element spacing may be uniform or not. In alternative embodiments, a metal-oxide coating layer may comprise one or more metal-oxide layers of different compositions resulting in one or more different refractive indices in the one or more layers. Non-stoichiometric compositions of metal-oxide materials may be incorporated to achieve varying indices of refraction and extinction coefficients. In embodiments where multiple layers are employed a layer of silicon dioxide integral to other layers may be of utility to enable additional light transmissive or inhibiting capabilities of a multilayer coating. Feature sizes of patterns and photonic crystal shapes may vary from about 50 nm to more than several microns depending on a requirement.

Foregoing described embodiments of the invention are provided as illustrations and descriptions. They are not intended to limit the invention to precise form described. In particular, it is contemplated that functional implementation of invention described herein may be implemented equivalently. Alternative construction techniques and processes are apparent to one knowledgeable with integrated circuit and MEMS technology. Other variations and embodiments are possible in light of above teachings, and it is thus intended that the scope of invention not be limited by this Detailed Description, but rather by Claims following.

What I claim is:

1. A light emitting device comprising:
   a substrate portion having a top surface and a bottom surface;
   a back reflector formed on the bottom surface of the substrate portion;
   a light emitting portion formed on the top surface of the substrate portion, the light emitting portion having a flat top surface;
   a coating layer portion comprising a first coating layer of ITO and a second coating layer, wherein the first coating layer is in direct physical contact with the flat top surface of the light emitting portion and has a contiguous flat top surface, and the second coating layer is in direct physical contact with the first coating layer and has a top surface with a three dimensional pattern formed on the flat top surface of the first coating layer, the three dimensional pattern chosen from a group consisting of ribs, cylinders, polygon shaped ribs, triangular shaped ridges, hemispherical shaped mounds, horizontal cylindrical shaped ribs, ellipsoids, hemispheres, rectilinear trenches, rectilinear solids, cones, angled cylinders, angled hemispheres, angled ellipsoids, angled rectilinear trenches, angled solids and angled cones and wherein element to element spacing may be uniform or not, wherein the second coating layer has an index of refraction greater than 2 and an optical loss factor less than 0.2 and is chosen from a group consisting of metal oxides, silicon carbide, $Ta_2O_5$, $Nb_2O_5$, $TiO_2$, and their non-stoichiometric mixtures; and
   a metal contact formed in direct contact with the first coating layer, the three dimensional pattern formed on the flat top surface of the first coating layer has a top portion higher than a top surface of the metal contact.

2. The light emitting device of claim 1, wherein the light emitting portion comprises:
   a first cap layer of a first conductivity type adjacent to the substrate portion;
   an active region comprising one or more layers separated from the substrate portion by the first cap layer;
   a second cap layer of a second conductivity type;
   one or more contact layers in contact with the active region through the second cap layer; and
   one or more electrode layers in contact with one of the one or more contact layers.

3. The light emitting device of claim 1, wherein the substrate portion is chosen from a group comprising sapphire, silicon carbide, GaN, and silicon.

4. The light emitting device of claim 1, wherein the index of refraction of the second coating layer is greater than 2.45, and the optical loss factor of the second coating layer is less than 0.1.

5. A light emitting device comprising:
   a substrate portion having a top surface and a bottom surface;
   a back reflector formed on the bottom surface of the substrate portion;
   a light emitting portion formed on the top surface of the substrate portion and including a gallium nitride layer which has a flat top surface;
   a contiguous transparent conductive layer formed in direct contact with the flat top surface of the gallium nitride layer and having a top surface;
   a coating layer formed in direct physical contact with the top surface of the transparent conductive layer and having a top surface with a three dimensional pattern formed on the top surface of the transparent conductive layer, the coating layer having an index of refraction greater than 2 and an optical loss factor less than 0.2 and including a material selected from a group consisting of metal oxides, $Ta_2O_5$, $Nb_2O_5$, $TiO_2$, and their non-stoichiometric mixtures: and
   a metal contact formed in direct contact with the transparent conductive layer, the three dimensional pattern formed on the top surface of the transparent conductive layer has a top portion higher than a top surface of the metal contact.

6. The light emitting device of claim 5, wherein the three dimensional pattern is selected from a group consisting of ribs, cylinders, polygon shaped ribs, triangular shaped ridges, hemispherical shaped mounds, horizontal cylindrical shaped ribs, ellipsoids, hemispheres, rectilinear trenches, rectilinear solids, cones, angled cylinders, angled hemispheres, angled ellipsoids, angled rectilinear trenches, angled solids and angled cones.

7. The light emitting device of claim 5, wherein the index of refraction of the coating layer is greater than an index of refraction of the gallium nitride layer.

8. The light emitting device of claim 5, wherein the optical loss factor of the coating layer is less than 0.1.

9. The light emitting device of claim 5, wherein the transparent conductive layer is an indium tin oxide (ITO) layer.

10. The light emitting device of claim 5, wherein a top surface of the transparent conductive layer is roughened.

11. The light emitting device of claim 5, wherein a top surface of the transparent conductive layer is flat.

12. A light emitting device comprising:
  a substrate portion having a top surface and a bottom surface;
  a back reflector formed on the bottom surface of the substrate portion;
  a light emitting portion formed on the top surface of the substrate portion and including a gallium nitride layer which has a top surface;
  a contiguous transparent conductive layer formed in direct contact with the top surface of the gallium nitride layer and having a top surface;
  a coating layer formed in direct physical contact with the top surface of the transparent conductive layer and having a top surface with a three dimensional pattern formed on the transparent conductive layer, the coating layer having an index of refraction greater than 2 and an optical loss factor less than 0.2 and including a material selected from a group consisting of metal oxides, $Ta_2O_5$, $Nb_2O_5$, $TiO_2$, and their non-stoichiometric mixtures; and
  a metal contact formed in direct contact with the transparent conductive layer, the three dimensional pattern formed on the top surface of the transparent conductive layer has a top portion higher than a top surface of the metal contact.

13. The light emitting device of claim 12, wherein the three dimensional pattern is selected from a group consisting of ribs, cylinders, polygon shaped ribs, triangular shaped ridges, hemispherical shaped mounds, horizontal cylindrical shaped ribs, ellipsoids, hemispheres, rectilinear trenches, rectilinear solids, cones, angled cylinders, angled hemispheres, angled ellipsoids, angled rectilinear trenches, angled solids and angled cones.

14. The light emitting device of claim 12, wherein the index of refraction of the coating layer is greater than an index of refraction of the gallium nitride layer.

15. The light emitting device of claim 12, wherein the optical loss factor of the coating layer is less than 0.1.

16. The light emitting device of claim 12, wherein the transparent conductive layer is an indium tin oxide (ITO) layer.

17. The light emitting device of claim 12, wherein a top surface of the transparent conductive layer is roughened.

18. The light emitting device of claim 12, wherein a top surface of the transparent conductive layer is flat.

* * * * *